United States Patent [19]

Kanada et al.

[11] 4,297,429
[45] Oct. 27, 1981

[54] PHOTOGRAPHIC MATERIAL AND DIFFUSION TRANSFER PROCESSING SOLUTION FOR MAKING PRINTING PLATES AND METHOD FOR MAKING PRINTING PLATES

[75] Inventors: Eiji Kanada; Shoji Yamada; Yasuo Tsubai, all of Nagaokakyo, Japan

[73] Assignee: Mitsubishi Paper Mills, Ltd., Tokyo, Japan

[21] Appl. No.: 158,580

[22] Filed: Jun. 11, 1980

[30] Foreign Application Priority Data

| Jun. 18, 1979 [JP] | Japan | 54-76581 |
| Jun. 28, 1979 [JP] | Japan | 54-81831 |
| Jul. 2, 1979 [JP] | Japan | 54-83834 |
| Jul. 4, 1979 [JP] | Japan | 54-85743 |

[51] Int. Cl.³ .............................................. G03C 5/54
[52] U.S. Cl. ..................................... 430/204; 430/234; 430/229; 430/246; 430/251; 430/302
[58] Field of Search ............... 430/204, 251, 234, 455, 430/456, 419, 428, 229, 246, 302

[56] References Cited

U.S. PATENT DOCUMENTS

| 2,453,347 | 11/1948 | Russell | 430/428 |
| 2,857,276 | 10/1958 | Land et al. | 430/251 |
| 3,592,647 | 7/1971 | Blake et al. | 430/204 |
| 3,615,513 | 10/1971 | Haist et al. | 430/456 |
| 3,681,072 | 8/1972 | Debruyn | 430/229 |
| 3,721,559 | 3/1973 | DeHaes et al. | 430/204 |
| 3,894,871 | 7/1975 | Land | 430/229 |

OTHER PUBLICATIONS

"Organic Silver Complexing Agents . . . ," Haist et al., *Photo. Sci. and Engrg.*, vol. 5, No. 4, Jul./Aug. 1961, pp. 198-203.

Haist et al., "Inhibition of Silvering . . . ," *Photo. Sci. and Engrg.*, vol. 20, No. 6, Sep./Oct. 1976, pp. 220-224.

*Primary Examiner*—Mary F. Downey
*Attorney, Agent, or Firm*—Cushman, Darby & Cushman

[57] ABSTRACT

Lithographic printing plates having high ink receptivity, suffuring no ink stains and having much improved printing endurance can be produced by silver complex diffusion transfer process from lithographic printing plate materials comprising a support having thereon at least both silver halide emulsion layer and physical development nuclei layer wherein the diffusion transfer processing is carried out in the presence of 2-mercaptobenzoic acid derivatives or, besides this 2-mercaptobenzoic acid derivatives, at least one compound selected from the group consisting of alkanolamines and cyclic imide compounds which may be contained in at least one layers of the lithographic printing plate materials and/or the diffusion transfer developing solutions.

26 Claims, No Drawings

PHOTOGRAPHIC MATERIAL AND DIFFUSION TRANSFER PROCESSING SOLUTION FOR MAKING PRINTING PLATES AND METHOD FOR MAKING PRINTING PLATES

BACKGROUND OF THE INVENTION

This invention relates to lithographic printing plate materials (silver halide photographic materials) and diffusion transfer processing solutions for the production of lithographic printing plates by the silver complex diffusion transfer process and a method for making the lithographic printing plates.

Lithographic printing plates consist of greasy ink receptive oleophilic image portions and ink repellent oleophobic non-image portions, the latter being generally water receptive hydrophilic areas.

Therefore, the conventional lithographic printing is carried out by feeding both water and ink to the surface of printing plates to allow the image portions to receive preferentially the ink and the non-image portions to receive preferentially water and then transferring the ink on the image portions onto a substrate such as paper.

Thus, in order to obtain prints of good quality, it is necessary that the difference between oleophilicity of the surface of image portions and hydrophilicity of the surface of non-image portions is sufficiently large so that when water and ink are applied the image portions can receive sufficient amount of ink while the non-image portions may completely repel the ink.

Defects of lithographic printing plates made by silver complex diffusion transfer process (referred to as "DTR process" hereinafter) are as follows. The printing plates are poor in resistance against mechanical abrasion and ink receptivity of hydrophobic areas which carry ink images is gradually lost to result in decrease of printing endurance. Furthermore, the hydrophilic areas are gradually rendered hydrophobic and so the non-image areas, namely, background areas are apt to be stained with ink. Moreover, the hydrophobic image areas become unable to receive uniformly the greasy ink to cause unevenness of ink receptivity of the image areas.

There have already been printing plates in actual use which are produced by providing metallic silver patterns on the plates which are rendered ink-receptive. See, for example, U.S. Pat. Nos. 3,220,837 and 3,721,559, Japanese Patent Examined Publications (KOKOKU) No. 16725/73 and No. 30562/73 and Japanese Patent Unexamined Publications (KOKAI) No. 4482/71 and No. 21602/78 corresponding to U.S. patent 4,160,670. However, these printing plates have still the defects as enumrated above.

Like other lithographic printing plates, lithographic printing plates obtained by applying the DTR process are also required to be increased in their printing endurance by selecting construction of plate materials, composition of processing solutions, printing conditions, etc., but the effect which the state of transfer-developed silver particles give on printing characteristics of printing plates is a big factor for increasing the printing endurance. In order that the silver particles transfer-developed by the DTR process may have higher printing endurance, conditions for formation of transfer silver particles, such as diffusion speed of silver complex, stability and reducing rate and size and shape of the formed silver particles are important factors although construction of lithographic printing plates has some influence thereon.

A great number of compounds are known as silver complex forming agents used for DTR process. For making lithographic printing plates by applying DTR process, thiosulfates and thiocyanates have been considered most preferred and actually used from the economical point of view and the point of printing endurance of said transfer-developed silver particles. However, even these silver complex forming agents cannot provide lithographic printing plates having satisfactory printing endurance.

Various silver halide complexing agents to be used in development processing steps of DTR process are known and examples of these complexing agents are (1) thiosulfates, (2) thiocyanates, (3) amine thiosulfate anhydride disclosed in U.S. Pat. No. 3,169,992, (4) cyclic imide compounds disclosed in U.S. Pat. No. 2,857,276, etc. Printing plates made by development processing with these silver halide complexing agents have high sensitivity, resolving power and image reproducibility, but are inferior in printing endurance to other practically used printing plates (e.g., PS plates). Thus, methods for making printing plates having improved printing endurance and materials for making such printing plates have been demanded.

SUMMARY OF THE INVENTION

Objects of this invention are to provide method for making printing plates having high ink receptivity, suffering no ink stains and being conspicuously improved in their printing endurance by DTR process and lithographic printing plate materials (silver halide photographic materials) and DTR processing solution for making said printing plates.

DESCRIPTION OF THE INVENTION

The inventors have found that said objects can be attained by using 2-mercaptobenzoic acid derivatives as silver halide complexing agent in making printing plates by DTR process from the lithographic printing plate materials comprising a support having thereon at least both silver halide emulsion layer and physical development nuclei layer.

The 2-mercaptobenzoic acid derivatives as a silver halide complexing agent may be positioned so that 2-mercaptobenzoic acid derivatives and silver halide can produce soluble silver complex salts at the time of diffusion transfer development and therefore, as naturally be understood, they may be contained in lithographic printing plate materials and/or diffusion transfer developing solutions.

The 2-mercaptobenzoic acid derivatives used in this invention include compounds having such basic structure as having mercapto group at 2-position of benzoic acid and are preferably represented by the following general formula (1).

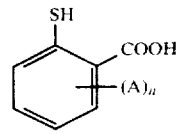

(wherein A represents a substituent on the benzene ring other than hydrogen, for example, a halogen atom, an alkyl group, an alkoxy group, amino group, an acyl amino group and nitro group and n is an integer of 0 to 4).

An important characteristic in said general formula (1) is that it bases on the structure having mercapto group at the position adjacent to carboxyl group, namely, 2-mercaptobenzoic acid and when it contains substitutent represented by A, influence caused by the kind and number of the substitutent is extremely small. Carbon number of alkyl group, alkoxy group, etc. is not limitative.

The DTR processing solution used for practice of this invention may be used ordinarily at a pH of at least 10, especially preferably at least 11. Therefore, the compounds of the general formula (1) are present substantially as anion of the compounds of the general formula (1) in an alkaline processing solution. Thus, it is essential that anion of the compounds of the general formula (1) is present in alkali processing solution used in this invention and the form of said compounds when added to developing composition or materials may be salt (e.g., sodium 2-mercaptobenzoate) and furthermore may be derivatives having protective group which can be easily eliminated with alkalis (e.g., S-acetylthiosalicylic acid). Thus, the form of the compounds is not limited to the form of the compounds of the general formula (1).

Therefore, the term "2-mercaptobenzoic acid derivatives" used in this specification means generically compounds which can be present substantially as anion of 2-mercaptobenzoic acid and its substituted derivatives in the alkali processing solution.

Examples of these compounds usable for practice of this invention are as follows:

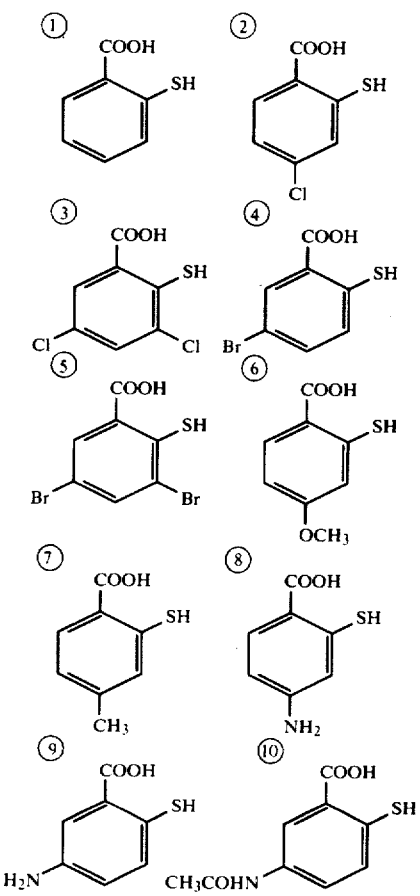

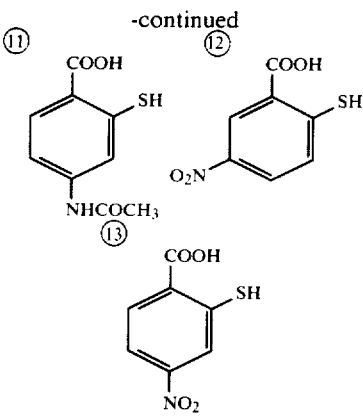

The above exemplified compounds and method for production of them are mentioned in Leon Katz et al "Journal of Organic Chemistry" 18, 1380–1402 (1953), M. N. Shehukina et al "Zhurnal Obshehei Khimii" 22, 1855–1861 (1952), etc.

It has been already found that mercapto compounds are good silver halide complexing agents. For example, U.S. Pat. No. 2,453,346 discloses use of various mercapto compounds and metallic salts in combination for stabilizing silver prints. Japanese Patent Examined Publication (KOKOKU) No. 11957/71 discloses use of various mercapto compounds in monobath developing solutions.

These mercapto silver halide complexing agents include the compounds represented by the general formula HS-R-Y (wherein R represents an alkylene or arylene group and Y represents a water solubilizing group) and examples thereof are as follows: mercaptoethanol, mercaptopropanol, mercaptoacetic acid, α-mercaptopropionic acid, β-mercaptopropionic acid, mercaptosuccinic acid, di-mercaptoadipic acid and mercaptobenzoic acid.

Silver images are formed when a printing plate material exposed imagewise is developed in the presence of said mercapto silver halide complexing agents contained in development processing solutions for DTR process or in printing plate materials. However, silver images obtained using these mercapto compounds which are other than those represented by the general formula (1) have no or little ink receptivity. Especially, silver images obtained using 3-mercaptobenzoic acid or 4-mercaptobenzoic acid have utterly no ink receptivity while silver images obtained using compounds of the general formula (1) have high ink receptivity and have conspicuously improved printing endurance as compared with those obtained using other silver halide complexing agents (e.g., thiosulfates). These effects of the compounds of the general formula (1) have never been expected from their structures and they are clearly distinguishable from other mercapto silver complexing agents. Another advantage of the compounds of the general formula (1) is that they have no smell which other mercapto compounds have and so the compounds of general formula (1) can be practically advantageously used.

In the present invention it is preferred not to substantially use the conventional thiosulfates or thiocyanates. If these silver halide solvents are used in combination with the compounds of the general formula (1), the object of this invention can be attained only by half.

Therefore, if used, the amount should be as small as not damaging the effects of this invention.

Another important feature of this invention resides in construction of lithographic printing plates. That is, the object of this invention cannot be attained with lithographic printing plates obtained by imagewise exposing a silver halide emulsion layer-carrying materials, bringing it into contact with a physical developing nuclei layer-bearing material and DTR developing the latent images as disclosed in Japanese Patent Unexamined Publication (KOKAI) No. 4482/71 and Japanese Patent Examined Publication (KOKOKU) No. 16725/73 and most of thus obtained printing plates did not have ink receptivity. On the other hand, it has been found that the object of this invention is attained when it is applied to lithographic printing plates comprising a support which bears at least both silver halide emulsion layer and physical developing nuclei layer as disclosed in Japanese Patent Unexamined Publication (KOKAI) No. 21602/78 corresponding to U.S. Pat. No. 4,160,670. Since this phenomenon does not occur with thiosulfates or thiocyanates, it is supposed that the silver halide complexing agents used in this invention form a different transferred silver which is in a suitable state for using as printing plates.

A very thin water permeable intermediate layer may be optionally provided between the emulsion layer and the nuclei layer, but preferably the emulsion layer and the nuclei layer are adjacent to each other. The nuclei layer may or may not contain hydrophilic colloid materials and if it is contained, the thickness of this layer is suitably less than about $1\mu$, preferably less than $0.5\mu$. This thickness is not limitative, but is one of the important factors in this invention.

The 2-mercaptobenzoic acid derivatives may be used in an amount of about 0.1 to about 100 millimol/l, preferably about 0.5 to about 50 millimol/l when it is contained in an alkaline DTR processing solution and about $10^{-3}$ to about 10 millimol/m$^2$, preferably $10^{-2}$ to 5 millimol/m$^2$ when it is contained in printing plate materials. When they are contained in the printing plate materials, they may be contained in at least one of silver halide emulsion layers, physical development nuclei layers, under coat layers and other optional constituting layers.

According to another preferred embodiment of this invention, further preferred results are obtained by using cyclic imide compounds having the following general formula in addition to the 2-mercaptobenzoic acid derivatives. That is, the 2-mercaptobenzoic acid derivative and the cyclic imide compound are contained together or separately in silver halide photographic materials used for producing lithographic printing plates by DTR process and/or DTR developing solutions. Said cyclic imide compounds are known as silver halide complexing agent in, for example, U.S. Pat. No. 2,857,276.

The cyclic imide compounds used in this invention together with the 2-mercaptobenzoic acid derivatives are represented by the following general formula.

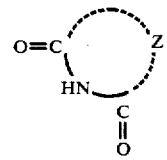

wherein Z represents atoms of a series completing a 5- or 6-membered cyclic imide nucleus which comprises from 1 to 3 nitrogen atoms and the remainder being carbon atoms and said atoms of a series may have substituent(s). Although the foregoing formula is in keto form, it is naturally intended to encompass the enolic modifications of compounds within its scope.

Examples of the substituents which attach to the atoms represented by Z are hydrogen atoms, amino radicals, aliphatic radicals containing from 1 to 4 carbon atoms, halogen atoms, keto oxygen

aromatic radicals, etc.

Typical preferred examples of the cyclic imides are as follows:

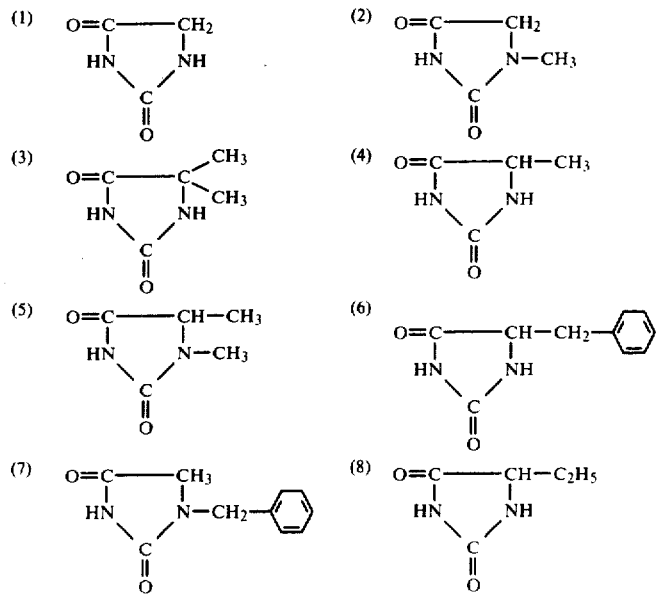

-continued
(9) 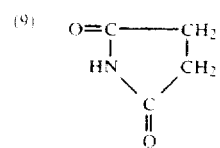 (10) 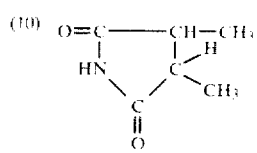
(11) 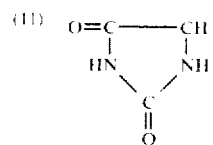 (12) 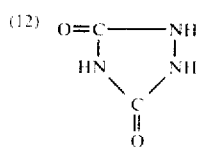
(13) 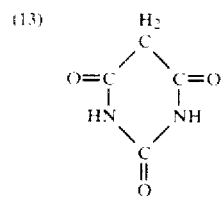 (14) 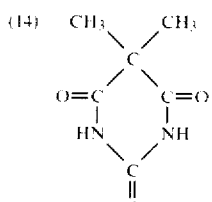
(15) 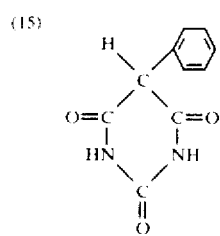 (16) 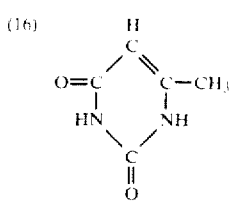
(17) 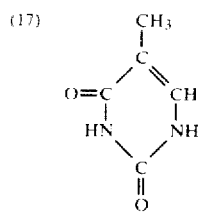 (18) 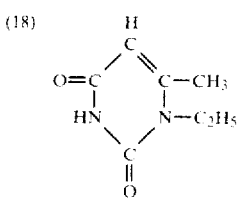
(19) 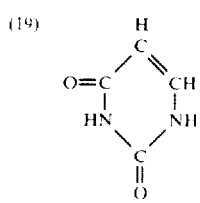 (20) 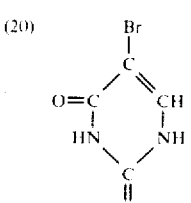
(21) 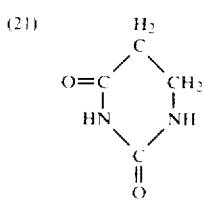 (22) 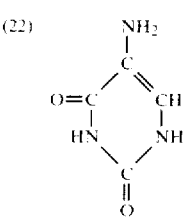
(23) 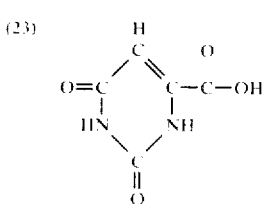 (24) 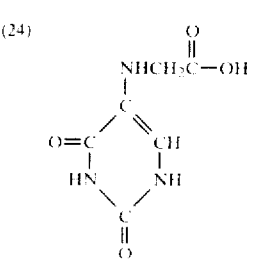

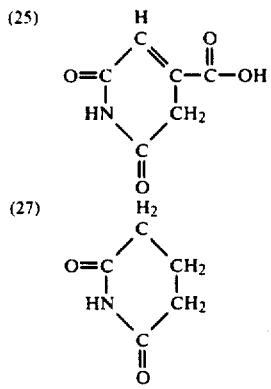

These cyclic imide compounds may be contained in lithographic printing plate materials (silver halide photographic materials for the preparation of lithographic printing plates) by adding in an amount of about 0.001–1 g/m² in the form of solutions in water or water-miscible organic solvents. Furthermore, they may be contained in DTR developing solution in an amount of about 0.1–30 g/l. These amounts are not critical and may vary within a certain range depending on various conditions. Of course, they may be used in both the printing plate materials and the processing solutions. Preferable results are obtained when they are contained in the printing plate materials.

When they are contained in DTR developing solution, a 5,5-dialkylhydantoin such as compound (3) exemplified above is especially preferred and the preferability of this compound becomes conspicuous after the lapse of time from preparation of the developing solution.

When cyclic imide compounds are contained in printing plate materials, they may be incorporated into at least one of physical developing nuclei layer, silver halide emulsion layer and other layers.

According to another preferred embodiment of this invention, it has been also found that further preferred results are obtained by using alkanolamines in addition to 2-mercaptobenzoic acid derivatives.

Alkanolamines which may be suitably used are preferably represented by the following general formula:

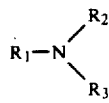

[wherein $R_1$ represents a hydroxyalkyl radical of 2–6 carbon atoms and $R_2$ and $R_3$ which may be identical or different represent hydrogen atom, hydroxyalkyl radical of 2–6 carbon atoms, benzyl radical, alkyl radical of 1–6 carbon atoms and

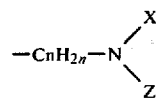

radical (wherein n is an integer of 1–6, and each X and Z is hydrogen atom, alkyl radical of 1–6 carbon atoms and hydroxyalkyl radical of 2–6 carbon atoms)].

Examples of these alkanolamines are ethanolamine, diethanolamine, triethanolamine, diisopropanolamine, 2-methylaminoethanol, 2-ethylaminoethanol, 2-dimethylaminoethanol, 2-diethylaminoethanol, 2-methyl-2-amino-1-propanol, 1-diethylamino-2-propanol, 3-diethylamino-1-propanol, isopropylaminoethanol, 3-amino-1-propanol, 2-methyl-2-amino-1,3-propanediol, benzyldiethanolamine, 2-(hydroxymethyl)-2-amino-1,3-propanediol, etc.

The alkanolamines may be used in layers of printing plate materials and/or DTR developing solution, but preferably is contained in the latter because they are volatile.

Generally, they may be used in an amount of about 5 g—about 100 g, preferably about 5 g—about 60 g per 1 l of the developing solutions.

According to another especially preferred embodiment of this invention, especially preferred results are obtained by using said cyclic imide compounds and the alkanolamines in addition to the 2-mercaptobenzoic acid derivatives.

The silver halide emulsion for use in this invention may be any of the photographic emulsions such as those of chloride, bromide, chlorobromide, chloroiodide, bromoiodide, and chlorobromoiodide of silver and the most preferred is that containing at least about 50 mol% of silver chloride. Size, crystal habit and distribution of the silver halide grains are not limitative. Moreover, the silver halide emulsions can be prepared by any conventional methods usually known in the photographic field. The silver halide emulsions may be chemically sensitized by well-known methods and also may be spectral-sensitized for blue, green and red. Antifoggants, stabilizers, developing agents, hardeners, matting agents (graining agents) may also be added. Preferred binder for the silver halide emulsion is gelatin, a part or whole of which may be substituted with other natural and/or synthetic hydrophilic colloid such as albumin, casein, polyvinyl alcohol, sodium alginate, sodium salt of carboxymethylcellulose, etc.

Weight ratio of the hydrophilic colloid to silver halide in terms of silver nitrate is generally 5 —0.3, preferably 2 —0.5.

Amount of silver halide coated on a support is about 0.2–5 g/m², preferably 0.5–3 g/m² in terms of silver nitrate.

Undercoat layers may be provided under the silver halide emulsion layers (and above the support) for purpose of antihalation. As the support may be used any conventional supports for photographic materials such as paper, glass, films such as cellulose acetate film, polyvinyl acetal film, polystyrene film, polypropylene film, polyethylene terephthalate film, composite films such as polyester, polypropylene, polystyrene films covered with polyethylene films, metals, metallized papers or metal/paper laminates. Papers one or both surfaces of which are coated with an α-olefin polymer such as polyethylene are also effective. These supports may contain antihalation dyes or pigments. If necessary, a thin layer of water-permeable binders such as methylcellulose, sodium salt of carboxymethylcellulose, hydroxyethylcellulose, hydroxyethyl starch, sodium alginate, polyvinyl alcohol, polyvinylpyrrolidone may be provided as an uppermost layer on the emulsion coated side of the support.

In practice of the DTR process the developer may be incorporated into silver halide emulsion layer and/or image receiving layer or other water-permeable layers adjacent thereto as disclosed in British Pat. Nos. 1,000,115, 1,012,476, 1,017,273, 1,042,477, etc. Therefore, in this case, as the processing solution used at developing stage the so-called "alkaline activating solution" containing no developer may be used.

The physical development nuclei layer, namely, an image receiving layer which is preferably adjacent to the silver halide emulsion layer may be provided above or under the silver halide emulsion layer, but preferably it is provided above it (i.e., not between the support and the emulsion layer).

Suitable physical development nuclei used in this invention are metals such as antimony, bismuth, cadmium, cobalt, palladium, nickel, silver, lead, zinc, etc. and their sulfides. The image receiving layer may not contain hydrophilic colloid, but may contain hydrophilic colloids such as gelatin, carboxymethylcellulose, gum arabic, sodium alginate, hydroxyethyl starch, dextrin, hydroxyethylcellulose, polystyrenesulfonic acid, vinylimidazole-acrylamide copolymer, polyvinyl alcohol, etc.

The image receiving layer may contain wetting agents such as hygroscopic materials, e.g., sorbitol, glycerol, etc. The image receiving layer may further contain pigments for preventing scumming such as barium sulfate, titanium dioxide, china clay, silver, etc., developing agents such as hydroquinone and hardeners such as formaldehyde.

The DTR processing solution used in this invention may contain alkaline materials such as sodium hydroxide, potassium hydroxide, lithium hydroxide, trisodium phosphate, etc., preservatives such as sulfites, thickeners such as hydroxyethylcellulose, carboxymethylcellulose, etc., anti-foggants such as potassium bromide, 1-phenyl-5-mercaptoterazole, etc., developers such as hydroquinone, 1-phenyl-3-pyrazolidone, etc., development modifiers such as polyoxyalkylene compounds, onium compounds, etc.

It has been found that in the DTR developing solution of this invention the most preferred results can be obtained when potassium cation concentration is 0.2 to 0.8 mol/l, preferably 0.3 to 0.6 mol/l.

The lithographic printing plates according to this invention may be made ink-receptive or ink-receptivity may be increased with compounds as disclosed in Japanese Patent Examined Publication (KOKOKU) No. 29723/73 and U.S. Pat. No. 3,721,559.

The conventional printing method, etch solutions, damping solutions, etc. may be used for carrying out printing with the lithographic printing plates of this invention.

The following nonlimiting examples further illustrate this invention.

EXAMPLE 1

A matting layer containing silica particles of 5μ in average particle size are provided on one surface of a both surfaces polyethylene-coated paper of 135 g/m². On another surface of said paper which had been subjected to corona discharge treatment was provided an antihalation layer containing carbon black and then on this layer was coated an orthochromatically sensitized high contrast silver chloride emulsion containing silica particles of 5μ in average particle size at a coating amount of 2.0 g/m² in terms of silver nitrate. These antihalation layer and emulsion layer contained formalin as a hardener. After drying, this material was left for 3 days at 40° C. and then on said emulsion layer was coated a palladium sulfide sol prepared by the following process at a rate of 10 g/m².

Preparation of the palladium sulfide sol

| | | |
|---|---|---|
| Liquid A | Palladium chloride | 5 g |
| | Concentrated hydrochloric acid | 40 ml |
| | Water | 1 l |
| Liquid B | Sodium sulfide | 8.6 g |
| | Water | 1 l |

Liquid A and liquid B were mixed with stirring. After 30 minutes, 1 N sodium hydroxide was added to the resultant mixture to adjust pH to 4 to obtain the sol.

The obtained lithographic printing plate material was exposed imagewise in a camera for letter-press having a image reverse mechanism and was developed with the following alkali processing solutions in which only the silver halide complexing agent was changed at 30° C. for 30 seconds.

Alkali processing solutions

| | |
|---|---|
| Sodium hydroxide | 20 g |
| Anhydrous sodium sulfite | 50 g |
| Hydroquinone | 10 g |
| 1-Phenyl-3-pyrazolidone | 1 g |
| Silver halide complexing agent* | 10 millimol |
| Water to make 1 l | |

*Silver halide complexing agents
Compound 1 Sodium thiosulfate pentahydrate
Compound 2 Mercaptoethanol
Compound 3 Mercaptoacetic acid
Compound 4 α-mercaptopropionic acid
Compound 5 β-mercaptopropionic acid
Compound 6 Mercaptosuccinic acid
Compound 7 2-mercaptobenzoic acid
Compound 8 3-mercaptobenzoic acid
Compound 9 4-mercaptobenzoic acid
Compound 10 S-acetylthiosalicylic acid
Compound 11 Sodium 2-mercaptobenzoate
Compound 12 4-chloro-2-mercaptobenzoic acid
Compound 13 4-amino-2-mercaptobenzoic acid After the development, the printing plate materials were treated with neutralizing solution having the following composition at 25° C. for 20 seconds to obtain printing plates.

The printing plates obtained by the development with compounds 1 to 13 were called printing plates 1-1 to 1-13, respectively.

Neutralizing solution

| | |
|---|---|
| Ethylene glycol | 5 g |

-continued

| | | |
|---|---|---|
| Colloidal silica (20% aqueous solution) | 1 g | |
| Citric acid | 10 g | |
| Sodium citrate | 35 g | |
| Water to make 1 l | | |

Thus produced lithographic printing plates were mounted on an offset printing machine, the following etch solution was applied to the whole plate surface and printing was carried out using the following damping solution.

Etch solution

| | |
|---|---|
| Water | 600 ml |
| Isopropyl alcohol | 400 ml |
| Ethylene glycol | 50 g |
| 3-Mercapto-4-acetamide-5-n-butyl-1,2,4-triazole | 1 g |

Damping solution (diluted to 10 times with water at use)

| | |
|---|---|
| Water | 880 ml |
| Succinic acid | 6 g |
| Boric acid | 8.4 g |
| Sodium sulfate | 25 g |
| Ethylene glycol | 100 g |
| Colloidal silica (20% aqueous solution) | 28 g |

Printing machine used was A. B. Dick 350 CD (Tradename of A. B. Dick Co., Ltd. for offset printing machine) and ink receptivity and printing endurance were evaluated as follows:

(1) Ink receptivity

Simultaneously with contacting the surface of the printing plates with an inked roller, feeding of papers was started and printed was continued until the image density of prints began to become inferior and ink receptivity was expressed by the number of prints obtained which had good image density. The term "non" means that the printing plates received no ink. A. B. Dick Offset Ink 3-1012 was used as the printing ink.

(2) Printing endurance

Printing of at least 1000 sheets of paper was continued and printing endurance was expressed by the number of prints before disappearance of ink in image areas began to occur.

The results are shown in Table 1.

TABLE 1

| Printing plates | Silver halide complexing agents | Ink receptivity | Printing endurance |
|---|---|---|---|
| Comparative printing plate | None | Non | — |
| 1-1 | Sodium thiosulfate pentahydrate | 20 | 1000 |
| 1-2 | Mercaptoethanol | Non | — |
| 1-3 | Mercaptoacetic acid | Non | — |
| 1-4 | α-mercaptopropionic acid | 50 | 200 |
| 1-5 | β-mercaptopropionic acid | Non | — |
| 1-6 | Mercaptosuccinic acid | Non | — |
| 1-7 | 2-mercaptobenzoic acid | 20 | at least 5000 |
| 1-8 | 3-mercaptobenzoic acid | Non | — |
| 1-9 | 4-mercaptobenzoic acid | Non | — |
| 1-10 | S-acetylthiosalcylic acid | 20 | at least 5000 |
| 1-11 | Sodium 2-mercaptobenzoate | 20 | at least 5000 |
| 1-12 | 4-Chloro-2-mercaptobenzoic acid | 20 | at least 5000 |
| 1-13 | 4-Amino-2-mercaptobenzoic acid | 20 | at least 5000 |

It will be recognized from the above results that printing plates 1-7, 1-10, 1-11, 1-12 and 1-13 which were developed with alkali processing solutions containing the compounds represented by the general formula (1) have higher ink receptivity and extremely higher printing endurance as compared with printing plates 1-1, 1-2, 1-3, 1-4, 1-5, 1-6, 1-8 and 1-9 which were developed with alkali processing solutions containing other silver halide complexing agents and the comparative printing plate.

EXAMPLE 2

A matting layer containing silica particles of 5μ in average particle size was provided on one surface of a both surfaces polyethylene coated paper of 135 g/m². On another surface of said paper which had been subjected to corona discharge treatment was provided an antihalation layer containing 2 g/m² of hydroquinone, 0.1 g/m² of 1-phenyl-3-pyrazolidone and carbon black and then on this layer were coated the same emulsion and palladium sol as those in Example 1 to obtain lithographic printing plate materials. These were exposed imagewise in a camera for letters press having an image reverse mechanism and were developed with the following alkali processing solutions at 30° C. for 30 seconds.

Alkali processing solution

| | |
|---|---|
| Sodium hydroxide | 20 g |
| Anhydrous sodium sulfite | 50 g |
| Silver halide complexing agent* | 10 millimol |
| Water to make 1 l | |

*Silver halide complexing agents were the same as those used in Example 1, namely, compounds 1 to 13.

After the development, the printing plate materials were neutralized with the same neutralizing solution as that of Example 1 to obtain printing plates. Printing plates obtained by the development with silver halide complexing agents of compounds 1 to 13 were called printing plates 2-1 to 2-13, respectively. Printing with these printing plates and evaluation thereof were carried out in the same manner as in Example 1. The results are shown in Table 2.

TABLE 2

| Printing plates | Silver halide complexing agents | Ink receptivity | Printing endurance |
|---|---|---|---|
| Comparative printing plate | None | Non | — |
| 2-1 | Sodium thiosulfate pentahydrate | 20 | 1,000 |
| 2-2 | Mercaptoethanol | Non | — |
| 2-3 | Mercaptoacetic | | |

TABLE 2-continued

| Printing plates | Silver halide complexing agents | Ink receptivity | Printing endurance |
| --- | --- | --- | --- |
| 2-4 | acid α-mercaptopropionic acid | Non 50 | — 200 |
| 2-5 | β-mercaptopropionic acid | Non | — |
| 2-6 | Mercaptosuccinic acid | Non | — |
| 2-7 | 2-mercaptobenzoic acid | 20 | At least 5,000 |
| 2-8 | 3-mercaptobenzoic acid | Non | — |
| 2-9 | 4-mercaptobenzoic acid | Non | — |
| 2-10 | S-acetylthiosalcylic acid | 20 | At least 5,000 |
| 2-11 | Sodium 2-mercaptobenzoate | 20 | At least 5,000 |
| 2-12 | 4-chloro-2-mercaptobenzoic acid | 20 | At least 5,000 |
| 2-13 | 4-amino-2-mercaptobenzoic acid | 20 | At least 5,000 |

It will be recognized from the above results in Table 2 that also when the printing plate materials contained the developer, printing plates 2-7, 2-10, 2-11, 2-12 and 2-13 which were developed with alkali processing solutions containing the compounds represented by the general formula (1) had high ink receptivity and extremely higher printing endurance as compared with printing plates 2-1, 2-2, 2-3, 2-4, 2-5, 2-6, 2-8 and 2-9 which were developed with alkali processing solutions containing other silver halide complexing agents and the comparative printing plate.

EXAMPLE 3

Printing plates were made in the same manner as in Example 1 except that each silver halide complexing agent used in the alkali processing solutions used in Example 1 was contained in an amount of 0.3 millimol/m$^2$ in the image receiving layers of the lithographic printing plate materials of Example 1 and that the processing solutions contained no silver halide complexing agent and then printing was carried out with the resultant printing plates in the same manner as in Example 1. Only sodium thiosulfate (compound 1) was not contained in the image receiving layer, but in the processing solution in an amount of 10 millimol/m$^2$ as in Example 1.

The same results as in Example 1 were obtained.

EXAMPLE 4

Example 2 was repeated in the same manner as Example 3 repeated Example 1. The same results as in Example 2 were obtained.

EXAMPLE 5

Example 4 was repeated except that the mercapto compounds were contained in an amount of 0.2 millimol/m$^2$ in silver halide emulsion layer. A great many excellent printed copies were obtained as in Examples 2 and 4.

EXAMPLE 6

A matting layer containing silica particles of 5μ in average particle size was provided on one surface of a both surfaces polyethylene-coated paper of 135 g/m$^2$. On another surface of said paper which had been subjected to corona discharge treatment was provided an antihalation layer containing carbon black and then on this layer was coated an orthochromatically sensitized high speed silver choride emulsion containing silica particles of 5μ in average particle size at a coating amount of 1.5 g/m$^2$ in terms of silver nitrate. These antihalation layer and emulsion layer contained formalin as a hardener. After drying, this material was warmed for 3 days at 40° C. and then on said emulsion layer was coated a palladium sulfide sol prepared by the following process at a rate of 5 m/min.

Preparation of the palladium sulfide sol

| Liquid A | Palladium chloride Hydrochloric acid Water | 5 g 40 ml 1 l |
| --- | --- | --- |
| Liquid B | Sodium sulfide Water | 8.6 g 1 l |

Liquid A and liquid B were mixed with stirring. After 30 minutes, the resultant mixture was purified by passing it through a column packed with ion-exchange resin made for preparation of pure water and then the following liquid C was added thereto to obtain a coating liquid. (PH was adjusted to 4.)

| Liquid C | Methylvinyl ether/maleic anhydride Copolymer (1.25%) 10% aqueous solution of saponin Water | 100 ml 200 ml 1.8 l |
| --- | --- | --- |

Thus obtained lithographic printing plate material was exposed imagewise in a camera for letter-press having an image reverse mechanism and was developed with the following silver complex diffusion transfer developing solutions (processing solutions) A-F at 30° C. for one minute.

Transfer developing solutions A-F

| Water | 750 ml |
| --- | --- |
| Sodium hydroxide | 10 g |
| Anhydrous sodium sulfite | 50 g |
| Hydroquinone | 10 g |
| 1-phenyl-3-pyrazolidone | 1 g |
| Silver halide complexing agent | x millimol |
| Water to make 1 l | |

These developing solutions contained the following complexing agents, respectively. The numeral in [] indicates amount of the compound used expressed by millimol.

| A | 2-mercaptobenzoic acid [15] + the exemplified cyclic imide compound (3) [40] |
| --- | --- |
| B | 2-mercaptobenzoic acid [15] + the exemplified cyclic imide compound (4) [40] |
| C | 2-mercaptobenzoic acid [15] + 2-methylaminoethanol [100] |
| D | 2-mercaptobenzoic acid [15] + 2-methylaminoethanol [100] + the exemplified cyclic imide compound (3) [40] |
| E | 2-methylaminoethanol [200] |
| F | the exemplified cyclic imide compound (3) [80] |

Thereafter, this lithographic printing plate material was passed between two squeezing rollers to remove excess developing solution and immediately thereafter was treated with a neutralizing solution having the following composition at 25° C. for 20 seconds. Then, excess solution was removed by squeezing rollers and the material was dried at room temperature.

Neutralizing solution

| Water | 600 ml |
|---|---|
| Citric acid | 10 g |
| Sodium citrate | 35 g |
| Colloidal silica (20% liquid) | 5 ml |
| Ethylene glycol | 5 ml |
| Water to make 1 l | |

Thus produced lithographic printing plate was mounted on an offset printing machine, the following etch solution was applied to the whole plate surface and printing was carried out using the following damping solution.

Etch solution

| Water | 600 ml |
|---|---|
| Isopropyl alcohol | 400 ml |
| Ethylene glycol | 50 g |
| 3-Mercapto-4-acetamide-5-n heptyl-1,2,4-triazole | 1 g |

Damping solution

| o-Phosphoric acid | 10 g |
|---|---|
| Nickel nitrate | 5 g |
| Sodium nitrite | 5 g |
| Ethylene glycol | 100 g |
| Colloidal silica (20% liquid) | 28 g |
| Water to make 2 l | |

Evaluation of the printing plates was made in the same manner as in Example 1 and the results are shown in Table 3.

TABLE 3

| Processing solution | Ink receptivity | Printing endurance |
|---|---|---|
| A | 10 | at least 8,000 |
| B | 10 | at least 8,000 |
| C | 10 | 8,000 |
| D | 10 | at least 10,000 |
| E | 25 | less than 500 |
| F | 20 | 2,500 |

It will be recognized that the printing plates obtained using the processing solutions A, B, C and D of this invention have excellent ink receptivity and printing endurance.

EXAMPLE 7

Lithographic printing plates were produced in the same manner as Example 6 except that 1.0 g/m$^2$ of hydroquinone and 0.5 g/m$^2$ of 1-phenyl-3-pyrazolidone were incorporated into the silver halide emulsion layer of Example 6 and the following transfer developing solution G and the same developing solution G to which each of the cyclic imide compounds (1), (3), (4), (5), (6), (8), (9), (14), (17), (19) and (21) exemplified hereinbefore was added in an amount of 10 g/l were used in place of transfer developing solutions A-F. Printing was carried out using thus obtained printing plates in the same manner as in Example 6.

Transfer developing solution G

| Water | 800 ml |
|---|---|
| Trisodium phosphate | 75 g |
| Anhydrous sodium sulfite | 50 g |
| Potassium bromide | 0.5 g |
| 2-mercaptobenzoic acid | 10 millimol |
| Water to make 1 l | |

The results were as follows: The printing plate produced using the developing solution G containing no cyclic imide compound could stand printing of at most about 5,000 copies while the printing plates produced using the developing solution G containing the cyclic imide compounds could stand printing of more than 8,000 copies. Furthermore, printing was carried out using printing plates obtained with the above developing solutions which were left for one week at room temperature after preparation. In this case, the printing plate produced with the developing solution containing the cyclic imide compound (3) had substantially the same printing endurance while other printing plates could stand printing of 4,000–7,000 copies.

EXAMPLE 8

Printing plate was produced in the same manner as in Example 7 except that 0.15 millimol/m$^2$ of the following compound was contained in the physical development nuclei layer of the lithographic printing plate material used in Example 7 and were developed with the following developing solution and printing was carried out in the same manner as in Example 6.

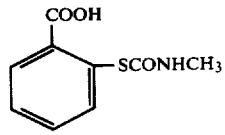

Transfer developing solution

| Sodium hydroxide | 20 g |
|---|---|
| Anhydrous sodium sulfite | 50 g |
| Cyclic imide compound No. (3) exemplified before | 5 g |
| Water to make 1 l | |

A great number of print copies were obtained as in Example 7.

EXAMPLE 9

Printing plates were produced in the same manner as in Example 7 except that each of the cyclic imide compounds used in Example 7 was contained in an amount of 0.5 g/m$^2$ in the physical development nuclei layer and the following transfer development solution was used and printing was carried out in the same manner as in Example 7.

Transfer developing solution

| Sodium hydroxide | 20 g |
|---|---|
| Anhydrous sodium sulfite | 50 g |
| 2-mercaptobenzoic acid derivative* | 20 millimol |

-continued

| | |
|---|---|
| Water to make 1 l | |

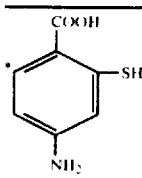

As in Example 7, a great number of good print copies were obtained using the resultant printing plates.

EXAMPLE 10

Printing plates were produced in the same manner as in Example 6 except that 1.0 g/m² of hydroquinone and 0.5 g/m² of 1-phenyl-3-pyrazolidone were contained in the antihalation layer and the following three kinds of developing solutions (totally eleven developing solutions) were used.

(1) Transfer developing solution

| Water | 750 ml |
|---|---|
| Potassium hydroxide | 20 g |
| Anhydrous sodium sulfite | 60 g |
| Potassium bromide | 0.5 g |
| 2-mercaptobenzoic acid | 10 millimol |
| 3-mercapto-4-acetamide-5-n-heptyl-1,2,4-triazole | 0.15 g |
| Water to make 1 l | |

(2) Five transfer developing solutions having the same composition as mentioned in above (1) to which 150 millimols of each of ethanolamine, 2-dimethylaminoethanol, 2-methyl-2-amino-1-propanol, 3-amino-1-propanol and 2-methyl-2-amino-1,3-propanediol was further added, respectively.

(3) Five transfer developing solutions of the above (2) to which the exemplified cyclic imide compound (3) was further added in an amount of 5 g.

Printing was carried out with the thus obtained printing plates in the same manner as in Example 6 to obtain the same results as in Example 6.

EXAMPLE 11

Printing plates were produced in the same manner as in Example 10 except that 0.2 millimol/m² of the undermentioned 2-mercaptobenzoic acid derivative was contained in the physical development nuclei layer and the undermentioned transfer developing solutions were used.

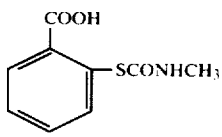

Transfer developing solution

| Potassium hydroxide | 20 g |
|---|---|
| Anhydrous sodium sulfite | 50 g |
| 2-methyl-2-amine-1-propanol | 15 g |
| Cyclic imide compound* | 40 millimols |
| Water to make 1 l | |

*As the cyclic imide compound, each of compounds (1), (3), (4), (5), (6), (8), (9), (13), (14), (17) and (19) exemplified before was used.

Printing was carried out with the thus obtained printing plates to find that all of them had printing endurance of more than 10,000 print copies.

EXAMPLE 12

Printing plates were produced in the same manner as in Example 10 except that each of the cyclic imide compounds (3), (6) and (9) was contained in an amount of 0.5 g/m² in the physical development nuclei layer and the undermentioned transfer developing solution was used and printing was carried out with the thus obtained printing plates. A great number of good print copies could be obtained with all of these printing plates as in Example 10.

Transfer developing solution

| Potassium hydroxide | 15 g |
|---|---|
| Trisodium phosphate | 10 g |
| Anhydrous sodium sulfite | 60 g |
| 2-mercapto-4-aminobenzoic acid | 15 millimols |
| 2-methyl-2-amino-1-propanol | 10 g |
| Water to make 1 l | |

What is claimed is:

1. Method for making a lithographic printing plate which utilizes the transfer silver as ink receptive portions which is formed by silver complex diffusion transfer process from a lithographic printing plate material which comprises a support having thereon at least both silver halide emulsion layer and physical development nuclei layer by imagewise-exposure of the silver halide emulsion layer and diffusion transfer development thereof with an alkaline processing solution, characterized in that diffusion transfer development processing is carried out in the presence of 2-mercaptobenzoic acid derivative.

2. Method for making a lithographic printing plate according to claim 1, wherein the diffusion transfer processing is carried out in the presence of the 2-mercaptobenzoic acid derivative and at least one compound selected from the group consisting of alkanolamine and cyclic imide compound having the following general formula:

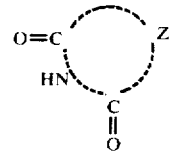

(wherein Z represents atoms of a series completing a 5- or 6-membered cyclic imide nucleus which comprises 1 to 3 nitrogen atoms and the remainder being carbon atoms and said atoms of a series may have substituent).

3. Method for making a lithographic printing plate according to claim 1 or 2, wherein the 2-mercaptobenzoic acid derivative is present in diffusion transfer developing (processing) solution.

4. Method for making a lithographic printing plate according to claim 1 or 2, wherein the 2-mercaptobenzoic acid derivative is present in constituting layer of the lithographic printing plate material.

5. Method for making a lithographic printing plate according to claim 2, wherein the alkanol amine is present in diffusion transfer developing solution.

6. Method for making a lithographic printing plate according to claim 2, wherein the cyclic imide compound is present in diffusion transfer developing solution.

7. Method for making a lithographic printing plate according to claim 2, wherein the cyclic imide compound is present in constituting layer of the lithographic printing plate material.

8. Method for making a lithographic printing plate according to claim 2, wherein the 2-mercaptobenzoic acid derivative, the alkanolamine and the cyclic imide compound are all present in diffusion transfer developing solution.

9. Method for making a lithographic printing plate according to claim 8, wherein content of the 2-mercaptobenzoic acid derivative is about 0.1 millimol/l to about 100 millimol/l.

10. Method for making a lithographic printing plate according to claim 4, wherein content of the 2-mercaptobenzoic acid derivative is about $10^{-3}$ millimol/m$^2$ to about 10 millimol/m$^2$.

11. Method for making a lithographic printing plate according to claim 8, wherein content of the alkanolamine is about 5 g/l to about 100 g/l.

12. Method for making a lithographic printing plate according to claim 8, wherein content of the cyclic imide compound is about 0.1 g/l to about 30 g/l.

13. Method for making a lithographic printing plate according to claim 7, wherein content of the cyclic imide compound is about 0.001 g/m$^2$ to about 1 g/m$^2$.

14. Lithographic printing plate material which comprises a support having thereon at least both silver halide emulsion layer and physical development nuclei layer, characterized in that 2-mercaptobenzoic acid derivative is contained in at least one of the constituting layers.

15. Lithographic printing plate material according to claim 14, wherein at least constituting layer contains the 2-mercaptobenzoic acid derivative and cyclic imide compound having the following general formula:

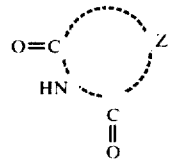

(wherein Z represents atoms of a series completing a 5- or 6-membered cyclic imide nucleus which comprises from 1 to 3 nitrogen atoms and the remainder being carbon atoms and said atoms of a series may have substituent).

16. Lithographic printing plate material according to claim 14 or 15, wherein content of the 2-mercaptobenzoic acid derivative is about $10^{-3}$ millimol/m$^2$ to about 10 millimol/m$^2$.

17. Lithographic printing plate material according to claim 14, wherein content of the cyclic imide compound is about 0.001 g/m$^2$ to about 1 g/m$^2$.

18. Lithographic printing plates made by the method of claim 1 or 2.

19. A method according to claim 1 wherein the 2-mercaptobenzoic acid derivative has the formula

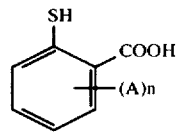

where A is a halogen atom, an alkyl group, an alkoxy group, an amino group, an acylamino group, or a nitro group; and n is 0 to 4.

20. A method according to claim 19 where n is 0.

21. A method according to claim 19 where n is 1–2 and A is halogen.

22. A method according to claim 19 where n is 1 and A is alkyl.

23. A method according to claim 19 where n is 1 and A is alkoxy.

24. A method according to claim 19 where n is 1 and A is amino.

25. A method according to claim 19 where n is 1 and A is acylamino.

26. A method according to claim 19 where n is 1 and A is nitro.

* * * * *